United States Patent
Yang et al.

(10) Patent No.: US 9,258,634 B2
(45) Date of Patent: Feb. 9, 2016

(54) MICROPHONE SYSTEM WITH OFFSET APERTURES

(71) Applicant: Invensense, Inc., San Jose, CA (US)

(72) Inventors: Jicheng Yang, North Andover, MA (US); Thomas M. Goida, Windham, NH (US)

(73) Assignee: INVENSENSE, INC., San Jose, CA (US)

( * ) Notice: Subject to any disclaimer, the term of this patent is extended or adjusted under 35 U.S.C. 154(b) by 206 days.

(21) Appl. No.: 13/795,026

(22) Filed: Mar. 12, 2013

(65) Prior Publication Data

US 2013/0195284 A1    Aug. 1, 2013

Related U.S. Application Data

(63) Continuation-in-part of application No. 12/847,682, filed on Jul. 30, 2010.

(51) Int. Cl.
| | |
|---|---|
| *H04R 9/08* | (2006.01) |
| *H04R 1/04* | (2006.01) |
| *B81B 7/00* | (2006.01) |
| *H04R 1/22* | (2006.01) |
| *H04R 19/00* | (2006.01) |

(52) U.S. Cl.
CPC ............... *H04R 1/04* (2013.01); *B81B 7/0061* (2013.01); *B81B 2201/0257* (2013.01); *B81B 2207/012* (2013.01); *H04R 1/222* (2013.01); *H04R 19/005* (2013.01)

(58) Field of Classification Search
USPC .................................. 381/360, 361, 174, 170
See application file for complete search history.

(56) References Cited

U.S. PATENT DOCUMENTS

| | | | |
|---|---|---|---|
| 6,522,762 B1 | 2/2003 | Mullenborn et al. | 381/174 |
| 6,732,588 B1 | 5/2004 | Mullenborn et al. | 73/715 |
| 6,781,231 B2 | 8/2004 | Minervini | 257/704 |
| 7,166,910 B2 | 1/2007 | Minervini | 257/704 |
| 7,242,089 B2 | 7/2007 | Minervini | 257/704 |
| 7,439,616 B2 | 10/2008 | Minervini | 257/704 |
| 7,475,597 B2 * | 1/2009 | Brida et al. | 73/715 |
| 7,763,488 B2 * | 7/2010 | Goodelle | B81C 1/00333 257/704 |
| 7,843,021 B2 | 11/2010 | Zhe et al. | 257/416 |
| 2003/0133588 A1 | 7/2003 | Pedersen | 381/423 |
| 2004/0184632 A1 | 9/2004 | Minervini | 381/355 |
| 2005/0189622 A1 * | 9/2005 | Humpston et al. | 257/659 |
| 2007/0057602 A1 | 3/2007 | Song | 310/328 |
| 2007/0058826 A1 | 3/2007 | Sawamoto et al. | 381/174 |
| 2008/0247585 A1 * | 10/2008 | Leidl et al. | 381/360 |
| 2010/0284553 A1 * | 11/2010 | Conti | B81B 7/0061 381/174 |

FOREIGN PATENT DOCUMENTS

| | | |
|---|---|---|
| WO | WO 01/41497 A1 | 6/2001 |
| WO | WO 02/45463 A2 | 6/2002 |
| WO | WO 2005/086532 A2 | 9/2005 |
| WO | WO 2006/116017 A2 | 11/2006 |

* cited by examiner

*Primary Examiner* — Davetta W Goins
*Assistant Examiner* — Amir Etesam
(74) *Attorney, Agent, or Firm* — Maryam Imam; IPxLaw Group LLP

(57) ABSTRACT

A microphone system has a base forming a base aperture, and a lid coupled to the base to form a package having an interior chamber. The system also has a member coupled with the base within the interior chamber, and a microphone die coupled to the member within the interior chamber. The member is positioned between the base and the microphone die and has a member aperture that is laterally offset from the base aperture. The member aperture, member, and base together form an acoustic path between the base aperture and the microphone die.

19 Claims, 7 Drawing Sheets

MICROPHONE SYSTEM WITH OFFSET APERTURES

PRIORITY

This patent application is a continuation in part of U.S. patent application Ser. No. 12/847,682, filed Jul. 30, 2010, entitled, "REDUCED FOOTPRINT MICROPHONE SYSTEM WITH SPACER MEMBER HAVING THROUGH-HOLE," and naming Thomas Goida as inventor, the disclosure of which is incorporated herein, in its entirety, by reference.

FIELD OF THE INVENTION

The invention generally relates to microphone systems and, more particularly, the invention relates to transducers.

BACKGROUND OF THE INVENTION

MEMS microphones typically are secured within the interior chamber of a package to protect them from the exterior environment. An integrated circuit chip, typically mounted within the interior chamber and having active circuit elements, processes electrical signals to and from the microphone. One or more apertures through some portion of the package permit acoustic signals to reach the microphone. Receipt of the acoustic signal causes the microphone, with its corresponding integrated circuit chip, to produce an electronic signal representing the acoustic qualities of the received signal.

Since they are exposed to the exterior environment through their apertures(s), MEMS microphones often are subject to high pressure events that can damage their fragile microstructure. In addition, the aperture(s) can serve as an opening to contaminants that also can damage the fragile microstructure of the microphone.

SUMMARY OF VARIOUS EMBODIMENTS

In accordance with one embodiment of the invention, a microphone system has a base forming a base aperture, and a lid coupled to the base to form a package having an interior chamber. The system also has a member coupled with the base within the interior chamber, and a microphone die coupled to the member within the interior chamber. The member is positioned between the base and the microphone die and has a member aperture that is laterally offset from the base aperture. The member aperture, member, and base together form an acoustic path between the base aperture and the microphone die.

The member may take any of a number of different forms, such as a circuit die or an inactive die/member. The package also can have metal to protect against electromagnetic interference. The base and/or member may be specially configured in their roles as forming part of the acoustic path. For example, the base can have a base recess that at least in part forms the acoustic path. In a similar manner, the bottom face of the member, which is adjacent to the base, may have a member recess that at least in part forms the acoustic path. Sealing material between the member and the base may seal at least a portion of the acoustic path between the base aperture and the member aperture The member and microphone die illustratively can be oriented in a stacked configuration. To that end, the microphone (which includes a backplate and a diaphragm that together form a variable capacitor) may position its backplate between its diaphragm and the member. Moreover, the member aperture can have a substantially uniform inner dimension, or a non-uniform inner dimension, along its longitudinal axis. The system can also have surface mountable pads on the base.

In accordance with another embodiment of the invention, a microphone system has a base forming a base aperture, a lid coupled to the base to form a package having an interior chamber, and a circuit die having active circuitry within the interior chamber. The circuit die is coupled with the base and has a circuit die aperture that is within the front volume of the interior chamber. The microphone system also has a microphone die coupled to the circuit die within the interior chamber. The circuit die is positioned between the base and the microphone die and has its aperture (i.e., the circuit die aperture) laterally offset from the base aperture.

In accordance with other embodiments of the invention, a microphone system has a base forming a base aperture, a lid coupled to the base to form a package having an interior chamber, and a member, with a member aperture, coupled with the base within the interior chamber. The microphone system also has a microphone die coupled to the member within the interior chamber in a stacked configuration. The microphone die is in acoustic communication with the member aperture, and the member is positioned between the base and the microphone die. The microphone die (which has a diaphragm and backplate that together form a variable capacitor) is positioned so that its backplate is between the diaphragm and the member. The member aperture and base aperture preferably are laterally offset.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a packaged microphone positions its internal microphone die in a manner that mitigates the potentially damaging effects of sudden high pressure events. To that end, the microphone die may be mounted on an intervening member within the interior chamber of a package.

The intervening member has an aperture that forms a portion of an acoustic channel from the package inlet aperture. One or both of the member and base of the package form a part of this acoustic channel, which indirectly extends from the inlet aperture. In other words, the acoustic channel does not directly or longitudinally extend straight from the inlet aperture of the package to the microphone. To provide this result, the member aperture is laterally offset from the inlet aperture, thus mitigating the effect of high pressure events. Details of illustrative embodiments are discussed below.

Figure 1:
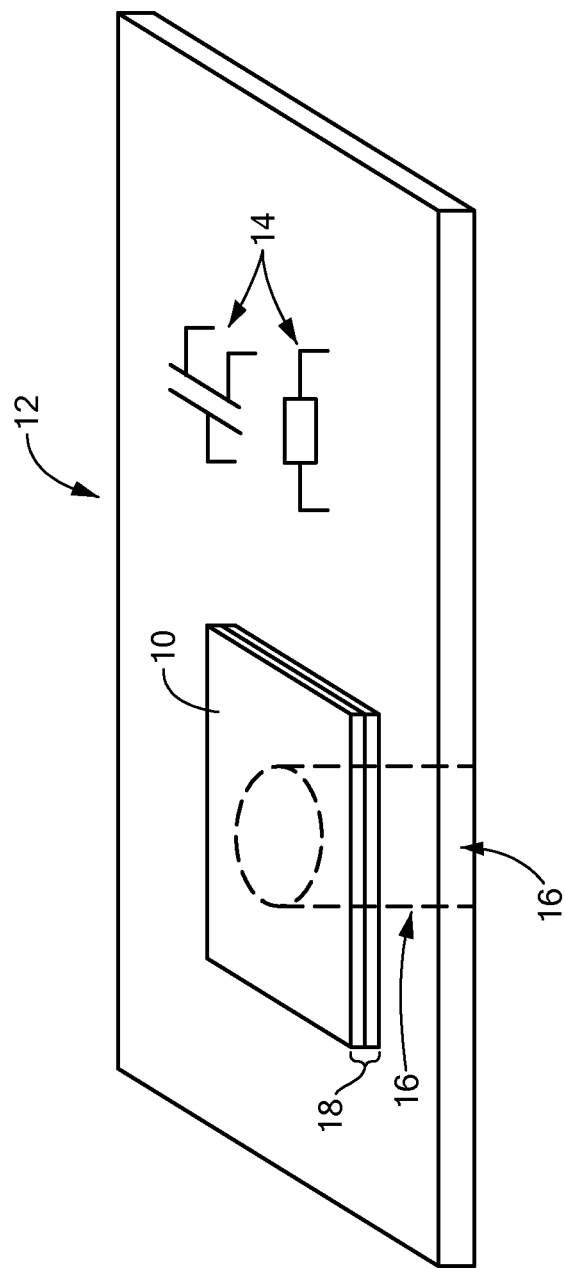
FIG. 1 schematically shows one use of a packaged microphone system configured in accordance with illustrative embodiments of the invention.

FIG. 1 schematically shows one application of a microphone system that can implement illustrative embodiments of the invention. Specifically, FIG. 1 schematically shows a printed circuit board 12 supporting and electrically interconnecting a packaged microphone 10 with additional components 14. The packaged microphone 10 cooperates with on-board and off-board circuitry to convert and deliver audio/acoustic signals to a larger system, such as a mobile telephone or public announcement system.

An aperture (shown in phantom) extends upwardly through the printed circuit board 12 to the bottom of the microphone package (identified by reference number 18, discussed in detail below). To ensure proper receipt of the acoustic signal, the microphone package 18 may be sealed to the top surface of the printed circuit board 12 by means of a gasket (e.g., formed from an elastomeric or other sealing material, not shown) or without a gasket, such as with some material. Accordingly, this arrangement produces an acoustic signal path through the printed circuit board 12, the gasket, and an inlet aperture in the bottom surface of the package 18.

Those skilled in the art can mount the packaged microphone 10 onto the printed circuit board 12 using any of a variety of different techniques. For example, surface mount technology or lead-through-board technologies (e.g., gull wing mounting) will suffice. Moreover, it should be noted that only the packaged microphone 10 and two other miscellaneous circuit components 14 are shown for simplicity. The circuit board 12 thus may have a number of other components, such as additional microphones, resistors, capacitors, transistors, application-specific integrated circuits, traces, contact pads, etc. . . .

Indeed, the packaged microphone 10 of this embodiment has a microphone package 18 that contains both a MEMS microphone (hereinafter "microphone die 20") and application-specific internal circuit ("ASIC 22" or "circuit die 22"). Illustrative embodiments may use a variety of different types of MEMS microphone dies, such as that shown in cross-section by example in FIGS. 4 and 5.

Figure 2:
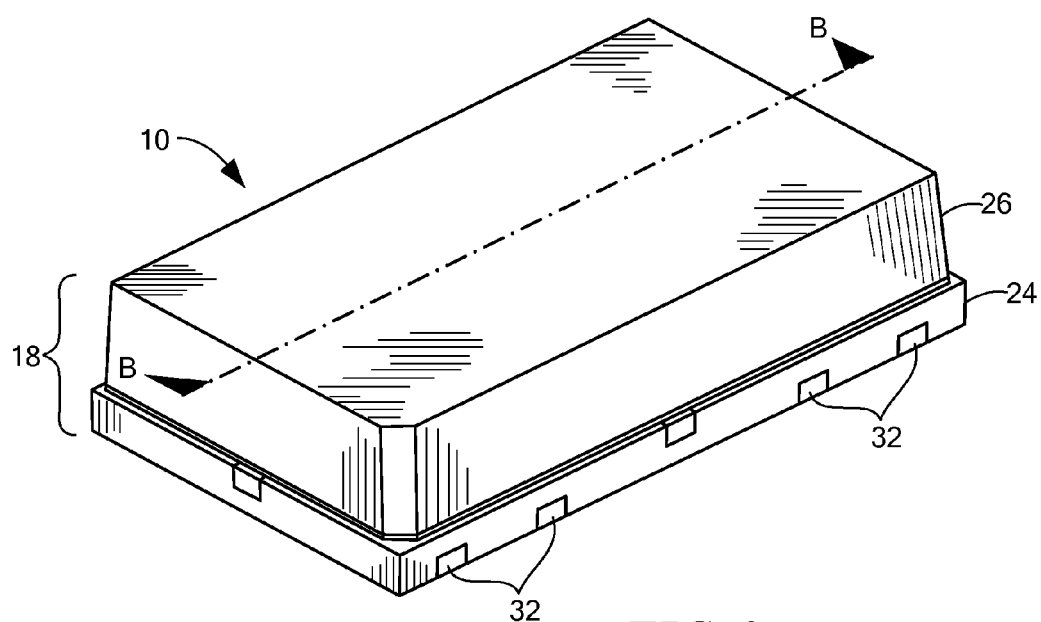
FIG. 2 schematically shows a top view of a packaged microphone that may be configured in accordance with illustrative embodiments of the invention.

To those ends, FIG. 2 schematically shows a top, perspective view of a packaged microphone 10 (also referred to as a "packaged microchip 10" or "microphone system 10") that may be configured in accordance with illustrative embodiments of the invention. In a corresponding manner, FIG. 3 schematically shows a bottom, perspective view of the same packaged microphone 10.

The packaged microphone 10 shown in those figures has a package base 24 that, together with a corresponding lid 26, forms an internal chamber 28 (shown in FIGS. 6 and 7) containing the noted microphone die 20 and, if desired, the noted separate circuit die 22. Alternatively, the microphone die 20 has on-chip circuitry, thus obviating the need for separate microphone circuitry within the chamber 28. The lid 26 in this embodiment is a cavity-type lid, which has four walls extending generally orthogonally from a top, interior face to form a cavity. The lid 26 secures to the top face of the substantially flat package base 24 to form the internal chamber 28.

Figure 3:
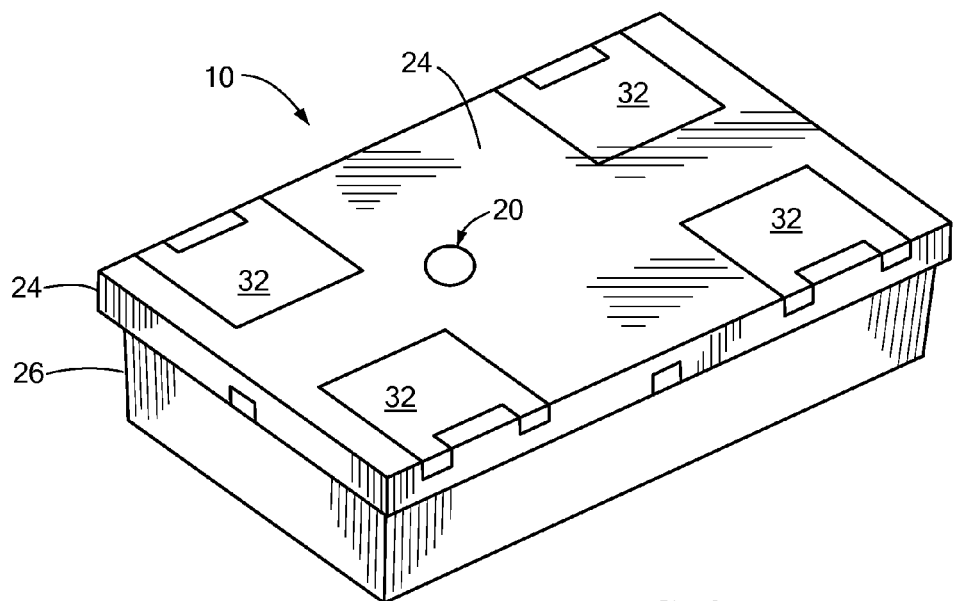
FIG. 3 schematically shows a bottom view of the packaged microphone shown in FIG. 2.

As shown in FIG. 3, the base 24 has an audio/acoustic input port 30 (also referred to as an "input aperture 30" or "inlet aperture 30") that enables ingress of audio/acoustic signals into the internal chamber 28. Acoustic signals entering the internal chamber 28 interact with the microphone die 20 to produce an electrical signal that, with additional (exterior) components (e.g., a speaker and accompanying on-chip or off-chip circuitry), produce an output audible signal corresponding to the input audible/acoustic signal.

In alternative embodiments, however, the inlet aperture 30 is at another location, such as through the top of the lid 26, or through one of the side walls of the lid 26. For example, the inlet aperture 30 can extend through the lid 26 with a similar channel 46 to the microphone die 20. The package 18 also may have two or more ports/apertures 30. For example, the package 18 could have a second input port (not shown) for directional sound purposes, or, in various embodiments, have a separate valve port (discussed below). Accordingly, discussion of a package 18 having its inlet aperture 30 through the base is but one example of a variety of different embodiments.

FIG. 3 also shows a number of base contacts 32 for electrically (and physically, in many anticipated uses) connecting the microphone die 20 with a substrate, such as the printed circuit board 12 of FIG. 1 or other electrical interconnect apparatus. For example, the base contacts 32 may be surface mountable pads or leads. The packaged microphone 10 may be used in any of a wide variety of applications. For example, the packaged microphone 10 may be used with mobile telephones, land-line telephones, computer devices, video games, biometric security systems, two-way radios, public announcement systems, camcorders, and other devices that transduce signals.

In illustrative embodiments, the package base 24 shown in FIGS. 2 and 3 is a premolded, leadframe-type package (also referred to as a "premolded package"). Other embodiments may use different package types, such as, among other types, ceramic cavity packages, substrate package, or laminate base (e.g., BT) packages. Accordingly, discussion of a specific type of package base is for illustrative purposes only.

The package 18 may have selective metallization to protect it from electromagnetic interference. For example, the lid 26 could be formed from stainless steel, while the base 24 could include printed circuit board material, such as FR-4 substrate material. Alternatively, the lid 26 could be formed from an insulator, such as plastic, with an interior conductive layer. Other embodiments contemplate other methods for forming an effective Faraday cage that reduces electromagnetic interference with the internal microphone die 20. Moreover, various embodiments may form the base 24 and lid 26 from similar or the same materials. For example, both can be formed from a laminate, or the lid 26 can be formed from a laminate, while the base 24 can be formed from a carrier or pre-molded leadframe.

Figure 4:
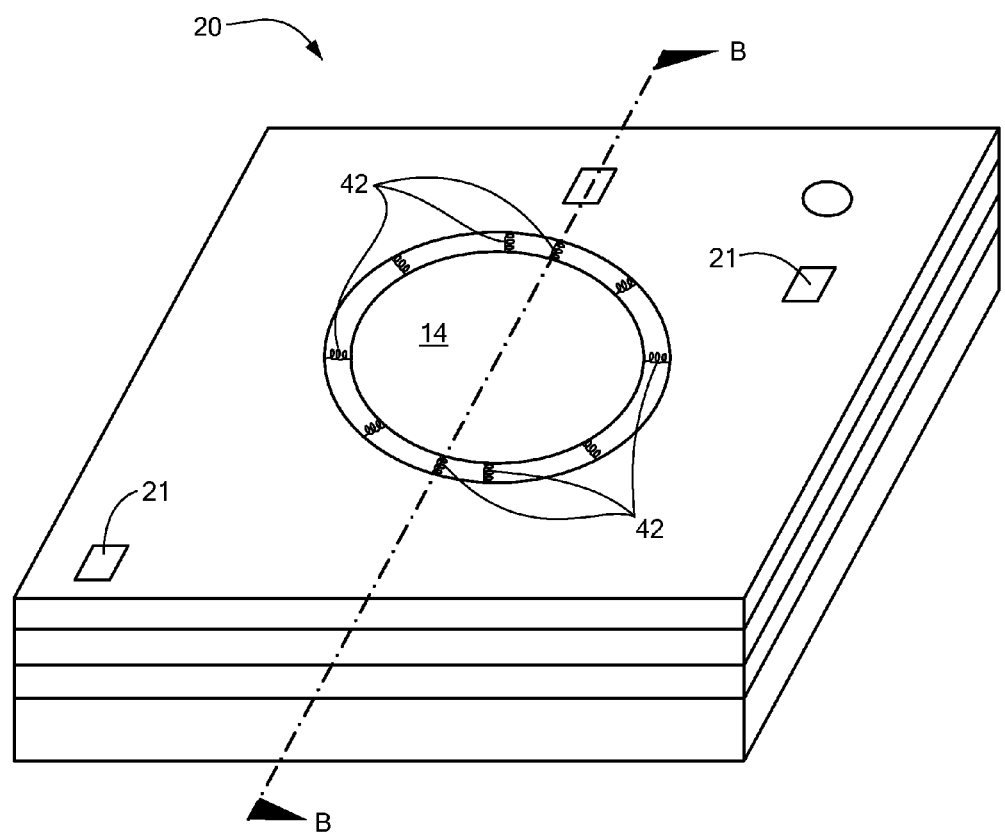
FIG. 4 schematically shows a perspective view of a microphone die that may be used in accordance with illustrative embodiments of the invention.

The internal chamber 28 can contain any of a variety of different types of microphone dies 20. To that end, FIG. 4 schematically shows a perspective view of one type of microphone die 20 that may be used in illustrative embodiments. For more detail, FIG. 5 schematically shows a cross-sectional view of the microphone die 20 of FIG. 4.

Among other things, the microphone die 20 includes a static backplate 34 that supports and forms a variable capacitor with a flexible diaphragm 36. In illustrative embodiments, the backplate 34 is formed from single crystal silicon (e.g., the top layer of a silicon-on-insulator wafer), while the diaphragm 36 is formed from deposited polysilicon. Other embodiments, however, use other types of materials to form the backplate 34 and the diaphragm 36. For example, a single crystal silicon bulk wafer, or some deposited material may form the backplate 34. In a similar manner, a single crystal silicon bulk wafer, part of a silicon-on-insulator wafer, or some other deposited material may form the diaphragm 36. To facilitate operation, the backplate 34 has a plurality of through-holes 38 that lead to a backside cavity 40. As discussed below, these through-holes 38 have a secondary function of acting as a filter that helps prevent debris from contacting the diaphragm 36.

Springs 42 movably connect the diaphragm 36 to the static portion of the microphone die 20, which includes the backplate 34. Audio/acoustic signals cause the diaphragm 36 to vibrate, thus producing a changing capacitance. On-chip or off-chip circuitry (e.g., the circuit die, among other things) receive and convert this changing capacitance into electrical signals that can be further processed.

Figure 5:
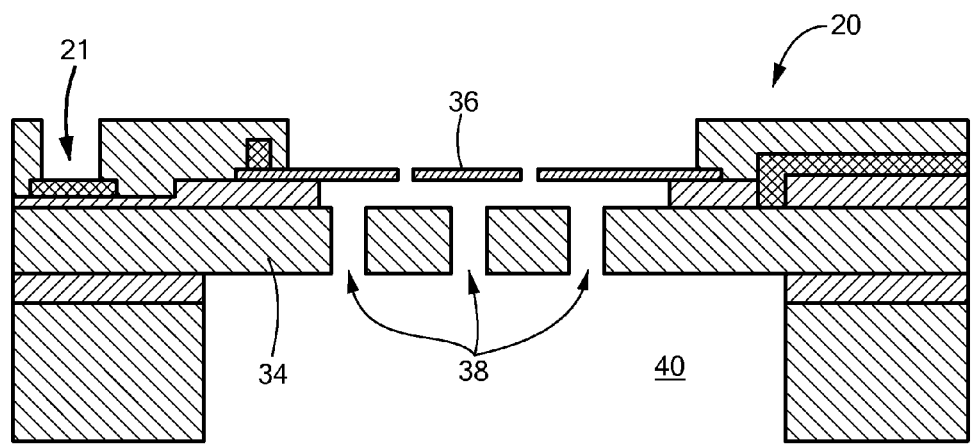
FIG. 5 schematically shows a cross-sectional view of the microphone die shown in FIG. 4.

It should be noted that discussion of the specific microphone die shown in FIGS. 4 and 5 is for illustrative purposes only. For example, a microphone die having a diaphragm 36 between its backplate 34 and backside cavity 40 also should suffice. Other microphone configurations thus may be used with illustrative embodiments of the invention.

Figure 6:
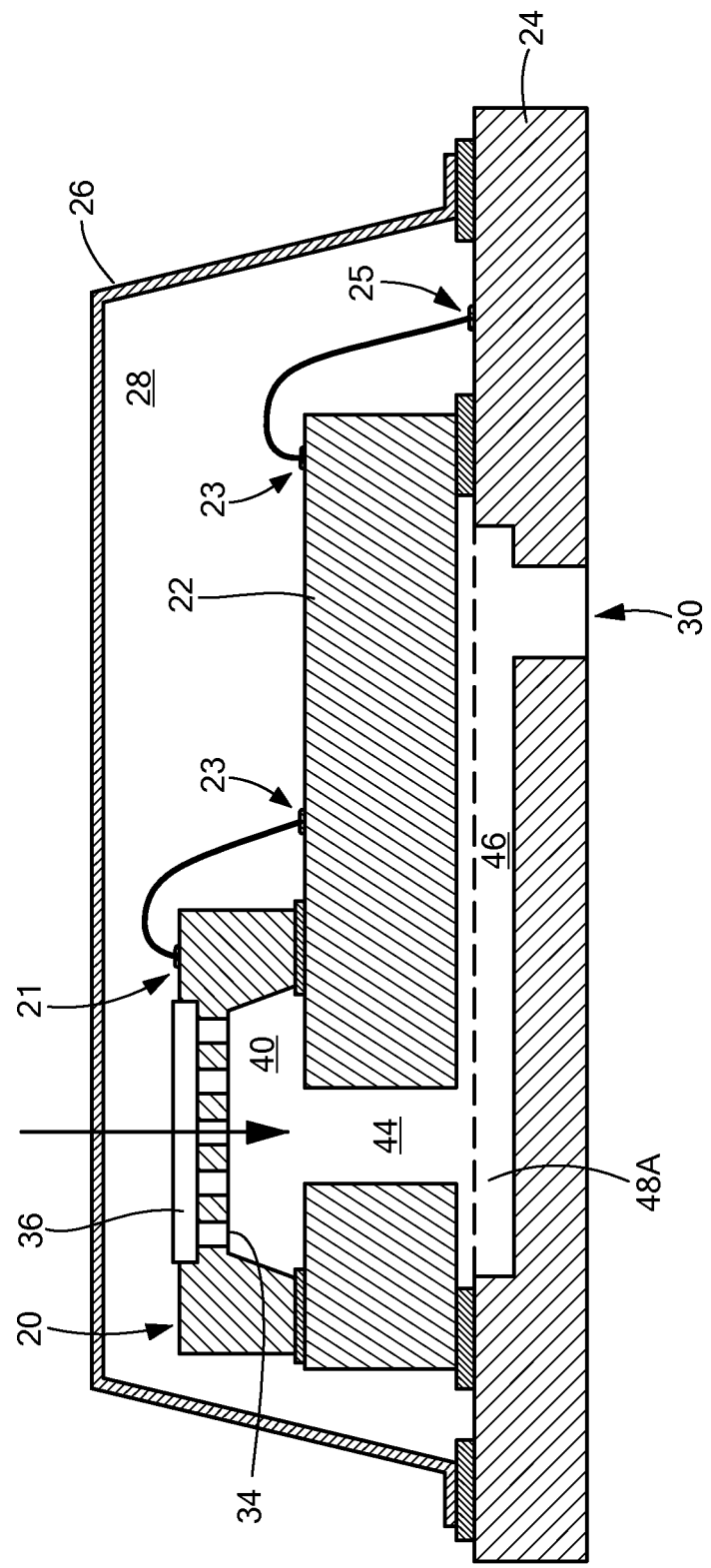
FIG. 6 schematically shows a cross-sectional view of the packaged microphone shown in FIG. 2 in accordance with one embodiment of the invention.

Illustrative embodiments of the invention mount the microphone die 20 and the circuit die 22 within the package 18 to both reduce package size and minimize the risk of contaminating the diaphragm 36 with debris entering the interior 36 through the inlet aperture 30. To that end, the microphone die 20 and circuit die 22 are mounted in a stacked configuration within the package 18. Specifically, FIG. 6 schematically shows a cross-sectional view of the microphone die 20 and circuit die 22 in this stacked configuration, in which the microphone die 20 is stacked upon the top, generally planar surface of the circuit die 22 within the interior chamber 28 formed by the lid 26 and base 24. Accordingly, as shown, the microphone die 20 and circuit die 22 share at least one vertical/longitudinal plane from the perspective of the drawings.

When mounted in this manner, preferred embodiments position the microphone die 20 so that the backplate 34 is between the circuit die 22 and the diaphragm 36. In addition to providing a reference capacitor plate, the backplate 34 in this embodiment also serves as a filter that further aids in preventing debris from contacting the diaphragm 36. Accordingly, the holes 38 through the backplate 34 are sized and positioned in a manner that maximizes its filtering function without impacting its capacitive function. As discussed below, this filter is but one of several means for protecting the diaphragm 36 in this manner.

Unlike conventional ASICs, the circuit die 22 in this embodiment has an aperture (referred to herein as "circuit die aperture 44") directly through its body. The circuitry of the circuit die 22 therefore is positioned generally about the general periphery of the circuit die body, or toward a portion of the circuit die periphery. The circuit die aperture 44 forms a part of an audio/acoustic signal channel 46 that permits audio/acoustic signals to contact the diaphragm 36. In this embodiment, the microphone die 20 is mounted directly over the circuit die aperture 44. Other embodiments may mount the microphone die 20 over a different part of the circuit die 22.

A number of different attachment means can be used to secure the bottom surface of the microphone die 20 to the top, generally planar surface of the circuit die 22. For example, an adhesive about the periphery of the circuit die aperture 44 can provide this function. Alternatively, a nonconductive epoxy film can secure the microphone die 20 to the circuit die 22. Such epoxy film may have a plurality of holes that effectively form another filter for the audio channel 46. The holes may be sized and positioned relative to the backplate holes 38 to maximize its filtering capabilities. Of course, discussion of a nonconductive epoxy film with filter holes is but one of many ways to connect the two dies together. For example, among other things, an epoxy film with a single hole, a seal ring, or other technique also should suffice.

As noted above, the circuit die aperture 44 may include only a single hole. This circuit die aperture 44 may have any of a number of different shapes, such as that of an ellipse, circle, or rectangle. For example, a generally square circuit die 22 having a length and width of about 1.36 millimeters mounted to a smaller microphone die 20 can have a generally circular circuit die aperture 44 with a diameter of about 0.6 millimeters. Illustrative embodiments ensure that the inner dimension of the circuit die aperture 44 is substantially uniform (e.g., having a cylindrical shape) through the entire body of the circuit die 22. In other words, the inner dimension of the circuit die aperture 44 has a substantially uniform inner dimension along its longitudinal axis. Alternative embodiments may have varying inner dimensions.

In other embodiments, the circuit die 22 has a plurality of circuit die apertures 44. These circuit die apertures 44 collectively can have a diameter that is comparable to that of the embodiments using a single circuit die aperture 44.

Figure 7:
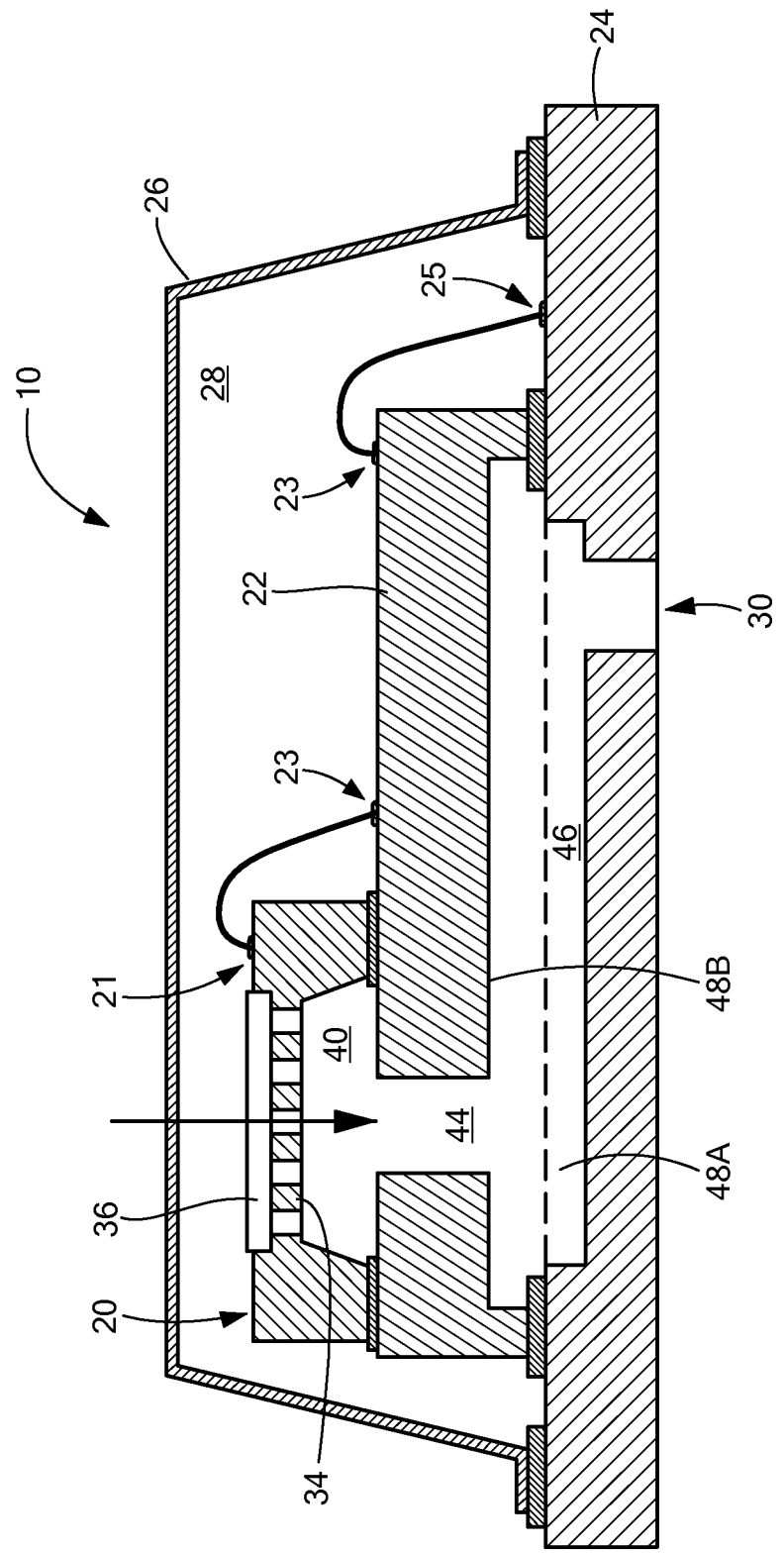
FIG. 7 schematically shows a cross-sectional view of the packaged microphone shown in FIG. 2 in accordance with another embodiment of the invention.

Specifically, the outside area of these circuit die apertures 44 has a collective diameter that is comparable to the single circuit die aperture 44 of FIGS. 6 and 7. Again, as with the epoxy film and the backplate 34, those skilled in the art can configure the pattern of circuit die apertures 44 in a manner that maximizes debris filtering.

Some embodiments have even more filters. Specifically, some embodiments position filtering material within the base aperture 30 of the package 18. Such filtering material may be an insert, or integrated directly into the base 24.

Yet other embodiments can have another filter between the bottom surface of the circuit die 22 and the top surface of the base 24. For example, a nonconductive film with filter holes can secure the entire chip system (i.e., the stacked microphone die 20 and circuit die 22) to the top surface of the base 24.

Those skilled in the art should understand, however, that not all filters are necessary in all embodiments. For example, some implementations may use no additional filters, two filters, while others may use three filters, and others may use four or five filters. The combination of filters can depend upon a number of factors, including the application in which it is to be utilized, as well as the anticipated technique to be used for securing the packaged microphone 10 to the printed circuit board 12. In addition, those skilled in the art can configure and select the filter(s) to cooperate to maximize filtering, while minimizing acoustic resistance. For example, the holes through two adjacent but vertically spaced filters may be offset to more effectively capture debris.

In accordance with illustrative embodiments of the invention and as shown in FIG. 6, the circuit die aperture 44 is laterally offset from the package inlet aperture 30. Stated another way, from the perspective of the depiction in FIG. 6, the inlet aperture 30 of the package 18 is spaced to the left or the right of the circuit die aperture 44—toward the sides of the package 18. To acoustically communicate the two apertures 30 and 44, the base 24 has a recessed portion 48A that, together with the bottom face of the circuit die 22, channels acoustic signals from the inlet aperture 30 and through the circuit die aperture 44 to the microphone die 20. This base recess 48A thus forms a channel 46 that preferably is relatively long and narrow to direct the acoustic signal in the desired manner. Epoxy, solder, or other material seals the circuit die 22 with the base 24 to seal the acoustic channel 46 between the apertures 30 and 44. Accordingly, in this configuration, both apertures 30 and 44, the circuit die 22, and the acoustic (inlet) channel 46 are within the front volume of the interior chamber 28 (i.e., within the acoustic path between the inlet aperture 30 and the microphone diaphragm 36).

FIG. 7 schematically shows another embodiment in which the circuit die 22, like the base 24, also forms a recess 48B to channel 46 the acoustic signals toward the microphone die 20. In yet other embodiments, only the circuit die 22 has its recess 48B, while the base 24 has no recess.

Various embodiments consider one end of the apertures 30 and 44 to be located where they first open to the recesses 48A and 48B. In other words, the apertures 30 and 44 in FIG. 7 terminate at their respective recesses 48A and 48B. For example, from the perspectives of FIGS. 6 and 7, the inlet aperture 30 extends from the exterior bottom surface of the package 18 and ends at the bottom of the base recess 48A —where the base recess 48A begins in the upward direction (from the perspective of the drawings). In a similar manner, in FIG. 7, the circuit die aperture 44 extends from the top surface of the circuit die 22 and ends at the top of the circuit die recess 48B (the beginning of the circuit die recess 48B), which continues downwardly and merges with a volume formed by the top of the base recess 48A.

Accordingly, no portion of either aperture 30 and 44 is longitudinally aligned with the other aperture 30 and 44; i.e., the longitudinal projections of the apertures 30 and 44 do not intersect in any way. For example, if one were to project the inlet aperture 30 upwardly to the lid 26, and project the circuit die aperture 44 downwardly to the base 24, then their lateral spacing necessarily causes them not to intersect. A substantial portion of an upwardly directed, high-pressure signal through the inlet aperture 30 therefore would directly strike the bottom of the circuit die 22 and thus, would not directly strike the fragile microstructure of the microphone die 20.

In alternative embodiments, some portion of the apertures 30 and 44 are longitudinally aligned. For example, only the edges or small portions of the apertures 30 and 44 may be aligned. The still should provide improved results over prior art designs that directly align the substantial majority of their apertures 30 and 44.

The specific embodiments discussed thus far have primarily focused on using a circuit die 22 to provide the vertical spacing for the microphone die 20. Some embodiments, however, use another member, such as a spacing member (i.e., a spacing member other than the circuit die 22, which acts as a spacing member in some embodiments and also referred to using reference number "22"), to provide this function. For example, the spacing member 22 may include a silicon stud (i.e., an inactive piece of silicon) with an aperture 44. Other embodiments may include a plurality of spacing members 22 mounted to the base, and a circuit die 22 also mounted on the base 24, next to the chip system. These spacing members 22 have apertures 44 as discussed. Other embodiments stack a circuit die 22 with its circuit die aperture 44, and one or more spacing members 30 with their respective apertures 44, underneath the microphone die 20. The circuit die 22 may be positioned in that stack in any of a variety of locations, such as on the bottom—spaced from the microphone die 20, or directly contacting the microphone die 20. Yet other embodiments may omit the stacked configuration and simply use a recess 48A through the base 24.

Figure 8:
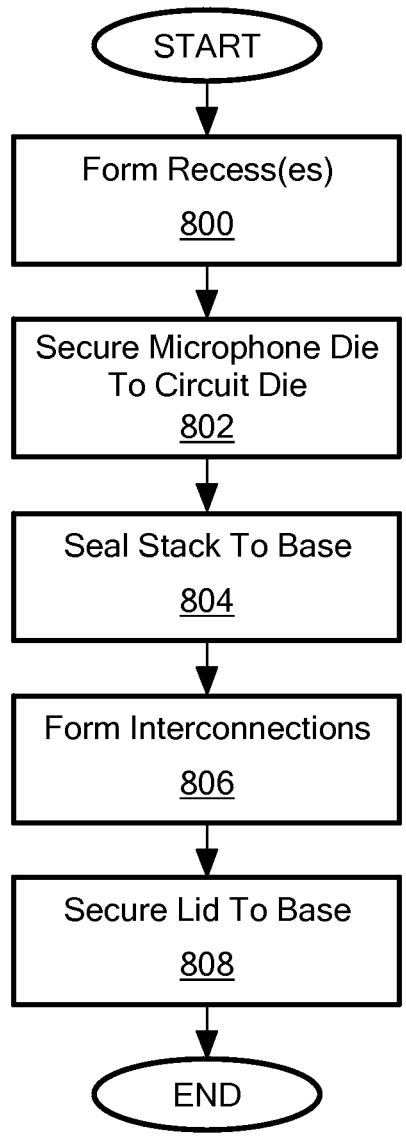
FIG. 8 shows a process of forming a packaged microphone in accordance with illustrative embodiments of the invention.

FIG. 8 shows a process of forming the microphone system in accordance with illustrative embodiments of the invention. It should be noted that for simplicity, this described process is a significantly simplified version of an actual process used to control the microphone system. Accordingly, those skilled in the art would understand that the process may have additional steps and details not explicitly shown in FIG. 8. Moreover, some of the steps may be performed in a different order than that shown, or at substantially the same time. Those skilled in the art should be capable of modifying the process to suit their particular requirements.

The process begins at step 800, which forms the recesses 48A and/or 48B in one or both of the circuit die 22 and the base 24. Any of a number of conventional processes may be used, depending upon the material of the circuit die and the base 24. For example, conventional acid, such as hydrofluoric acid (HF), can etch through a mask to form the recess 48B through the circuit die 22.

After forming one or both recesses 48A and 48B, the process continues to step 802, which secures the microphone die 20 to the circuit die. As noted above, any of a number of different adhesives, solders, epoxies, or films may be used. This step thus forms the stack, which then is sealingly attached to the base 24 to form the acoustic channel 46 between the inlet aperture 30 and the microphone die 20 (step 804). Again, as noted above, any of a number of different adhesives, solders, epoxies, or films may be used. Moreover, this connection preferably forms the acoustic channel 46 so that it is acoustically sealed.

Step 806 then electrically connects the microphone die 20 with the circuit die, and electrically connects both dies with the base 24. To that end, illustrative embodiments electric connect wirebonds from 1) pads 21 on the microphone die 20 to corresponding pads 23 on the circuit die 22, and 2) pads 23 on the circuit die 22 to corresponding pads 25 on the interior surface of the base 24. Accordingly, this step electrically connects the internal dies 20 and 22 with the external pads 32, thus providing electrical communication with the external environment, such as the circuit board of FIG. 1.

Finally, the process concludes by securing the lid 26 to the base 24. As with the other noted securing steps, any of a number of different coupling technologies should suffice, such as conductive and non-conductive adhesives, solders, epoxies, or films. For example, to protect against electromagnetic interference, the lid 26 and base 24 may be electrically connected.

Although the process is discussed in terms of forming a single packaged microphone 10, illustrative embodiments use batch processing techniques to form multiple microphone systems using the same process. For example, the base 24 may be processed as a panel having a two dimensional array of individual bases 24 that each forms one part of a single package 18. Accordingly, after securing the lids 26 to the individual bases 24, such embodiments dice or cut the base panel to form a plurality of packaged microphones 10.

Various embodiments therefore provide a number of benefits. Among others, such embodiments may mitigate the adverse effects of a high pressure event, reduce the footprint of the microphone package 18, and protect the microphone die 20 from contaminants that can damage its fragile microstructure.

Although the above discussion discloses various exemplary embodiments of the invention, it should be apparent that those skilled in the art can make various modifications that will achieve some of the advantages of the invention without departing from the true scope of the invention.

What is claimed is:
1. A microphone system comprising:
a base;
a lid coupled to the base to form a package having an interior chamber, the package having an inlet aperture;

a member coupled with the base within the interior chamber, the member having a member aperture, the member including a circuit die with a circuit die aperture; and
a microphone die connected to a substrate and having a diaphragm and coupled to the member within the interior chamber, the member being between the base and the microphone die,
the member aperture and inlet aperture being laterally offset,
the member aperture, member, and base forming an acoustic path between the inlet aperture and the microphone die,
wherein acoustic signals enter the inlet aperture and travel laterally between the circuit die and the substrate and in direct, lateral and simultaneous contact with the circuit die and the substrate, through an acoustic channel, the acoustic channel formed laterally between the member aperture and the inlet aperture and positioned directly below the circuit die and further wherein, the acoustic signals travel from the acoustic channel through the circuit die aperture in a direction toward the diaphragm and contact the diaphragm.

2. The microphone system as defined by claim 1 wherein the member comprises an inactive die.

3. The microphone system as defined by claim 1 wherein the package comprises metal to protect against electromagnetic interference.

4. The microphone system as defined by claim 1 wherein the base includes a base recess that at least in part forms the acoustic path.

5. The microphone system as defined by claim 1 wherein the member includes a bottom face that is adjacent to the base, the bottom face having member recess that at least in part forms the acoustic path.

6. The microphone system as defined by claim 1 wherein the member and the microphone die are in a stacked configuration.

7. The microphone system as defined by claim 1 wherein the backplate together with the diaphragm form a variable capacitor, the backplate being between the diaphragm and the member.

8. The microphone system as defined by claim 1 wherein the member aperture has a substantially uniform inner dimension along its longitudinal axis.

9. The microphone system as defined by claim 1 further comprising pads on the base, the pads being surface mountable.

10. The microphone system as defined by claim 1 further comprising sealing material between the member and the base to seal at least a portion of the acoustic path between the inlet aperture and the member aperture.

11. A microphone system comprising:
a base forming a base aperture;
a lid coupled to the base to form a package having an interior chamber, the package having an inlet aperture;
a circuit die having active circuitry within the interior chamber, the circuit die being coupled with the base and having a circuit die aperture; and
a microphone die connected to a substrate and having a diaphragm and a backplate and coupled to the circuit die within the interior chamber and forming the interior chamber into a front volume and a back volume, the circuit die being between the base and the microphone die, the circuit die aperture being within the front volume of the chamber;
the circuit die aperture and base aperture being laterally offset, wherein acoustic signals enter the inlet aperture and travel laterally between the circuit die and the substrate and in direct, lateral and simultaneous contact with the circuit die and the substrate, through an acoustic channel, the acoustic channel formed laterally between the member aperture and the inlet aperture and positioned directly below the circuit die and further wherein, the acoustic signals travel from the acoustic channel through the circuit die aperture, in a direction toward the diaphragm and contact the diaphragm.

12. The microphone system as defined by claim 11 wherein the microphone die is coupled over the circuit die aperture.

13. The microphone system as defined by claim 11 wherein the base includes a base recess that at least in part forms the acoustic path between the base aperture and the microphone die.

14. The microphone system as defined by claim 11 wherein the circuit die includes a bottom face that is adjacent to the base, the bottom face having a circuit die recess that at least in part forms an acoustic path between the base aperture and the microphone die.

15. A microphone system comprising:
a base forming a base aperture;
a lid coupled to the base to form a package having an interior chamber, the package having an inlet aperture;
a member coupled with the base within the interior chamber, the member having a member aperture; and
a microphone die connected to a substrate and coupled to the member within the interior chamber in a stacked configuration, the microphone die being in acoustic communication with the member aperture, the member being between the base and the microphone die, the microphone die having a diaphragm and backplate that together form a variable capacitor, the backplate being between the diaphragm and the member,
the member aperture and base aperture being laterally offset, wherein acoustic signals enter the inlet aperture and travel laterally through an acoustic channel and further wherein, the acoustic channel is formed laterally between the member aperture and the inlet aperture and positioned directly below the circuit die, the acoustic signals travel from the acoustic channel through a circuit die aperture in a direction toward the diaphragm and contacting the diaphragm, further wherein the acoustic signals are in direct, lateral and simultaneous contact with the circuit die and the substrate.

16. The microphone system as defined by claim 15 wherein the member comprises a circuit die, the circuit die having the circuit die aperture.

17. The microphone system as defined by claim 15 wherein the base includes a base recess that at least in part forms the acoustic path between the base aperture and the microphone die.

18. The microphone system as defined by claim 15 wherein the member includes a bottom face that is adjacent to the base, the bottom face having a member recess that at least in part forms the acoustic path between the base aperture and the microphone die.

19. The microphone system as defined by claim 15 wherein the member aperture has a substantially uniform inner dimension along its longitudinal axis.

* * * * *